United States Patent [19]

Curran

[11] Patent Number: 5,476,810
[45] Date of Patent: Dec. 19, 1995

[54] MANUFACTURE OF ELECTRONIC DEVICES COMPRISING THIN-FILM CIRCUITS USING A METAL FOIL AS A TEMPORARY SUPPORT

[75] Inventor: James E. Curran, Haywards Heath, England

[73] Assignee: U.S. Philips Corporation, New York, N.Y.

[21] Appl. No.: 368,523

[22] Filed: Jan. 4, 1995

[30] Foreign Application Priority Data

Jan. 31, 1994 [GB] United Kingdom ............. 9401770

[51] Int. Cl.$^6$ ............. H01L 21/68; H01L 21/336
[52] U.S. Cl. ............. 437/86; 437/974; 148/DIG. 135
[58] Field of Search ............. 437/21, 101, 86, 437/974; 148/DIG. 135; 156/664

[56] References Cited

U.S. PATENT DOCUMENTS

| | | | |
|---|---|---|---|
| 4,179,324 | 12/1979 | Kirkpatrick | 156/230 |
| 4,255,208 | 3/1981 | Deutscher et al. | 148/DIG. 135 |
| 4,345,967 | 8/1982 | Cook | 437/173 |
| 4,530,152 | 7/1985 | Roche et al. | 437/974 |
| 4,727,047 | 2/1988 | Bozler et al. | 437/86 |
| 4,772,564 | 9/1988 | Barnett et al. | 437/4 |
| 4,795,501 | 1/1989 | Stanbery | 136/249 |
| 4,846,931 | 7/1989 | Gmitter et al. | 156/633 |
| 4,883,561 | 11/1989 | Gmitter et al. | 156/633 |
| 5,053,355 | 10/1991 | von Campe | 437/114 |
| 5,127,964 | 7/1992 | Hamakawa et al. | 136/256 |
| 5,130,829 | 7/1992 | Shannon . | |
| 5,206,749 | 4/1993 | Zavracky et al. . | |
| 5,231,751 | 8/1993 | Sachdev et al. | 29/852 |
| 5,258,320 | 11/1993 | Zavracky et al. | 437/974 |
| 5,258,325 | 11/1993 | Spitzer et al. | 437/974 |
| 5,264,383 | 11/1993 | Young . | |
| 5,317,236 | 5/1994 | Zavracky et al. | 437/974 |
| 5,362,671 | 11/1994 | Zavracky et al. | 437/86 |
| 5,374,581 | 12/1994 | Ichikawa et al. | 437/86 |
| 5,391,257 | 2/1995 | Sullivan et al. | 437/86 |
| 5,399,231 | 3/1995 | McCarthy | 437/86 |
| 5,405,802 | 4/1995 | Yamagata et al. | 437/86 |
| 5,414,276 | 5/1995 | McCarthy | 437/86 |

FOREIGN PATENT DOCUMENTS

| | | |
|---|---|---|
| 0029334 | 5/1981 | European Pat. Off. . |
| 63-179529 | 7/1988 | Japan ............. 437/974 |

*Primary Examiner*—Mary Wilczewski
*Attorney, Agent, or Firm*—Paul R. Miller

[57] ABSTRACT

In manufacturing an electronic device comprising a thin-film circuit having semiconductor circuit elements (TFTs T1 & T2) processing limitations for the provision of the semiconductor film (1) and regions (5 & 6) of the semiconductor circuit elements are avoided by:

(i) forming at least the thin-film semiconductive body or bodies (1) for the semiconductor circuit elements on a temporary support (10), and (ii) subsequently transferring it/them to the device substrate (20), e.g of an insulating polymer material.

In a method in accordance with the invention, the temporary support is a metal foil (10) having opposite front and back faces (11 & 12) which are unattached over most of their area, the thin-film semiconductive body (1) is provided on the front face (11), and at least most of the metal foil (10) is etched away by etching into the back face (12) after the thin-film semiconductive body (1) is secured to the substrate (20). Very few processing steps are required for the provision, use and subsequent removal of such a simple temporary support (10), and it has advantageous properties when various device processing steps are carried out, e.g laser crystallisation and ion implantation. The back face (12) of the metal foil (10) may rest against a backing plate (13) and may be mounted in a frame (14) to which the backing plate (13) is secured to form a single transportable unit.

12 Claims, 4 Drawing Sheets

MANUFACTURE OF ELECTRONIC DEVICES COMPRISING THIN-FILM CIRCUITS USING A METAL FOIL AS A TEMPORARY SUPPORT

This invention relates to methods of manufacturing an electronic device comprising a thin-film circuit having semiconductor circuit elements, for example thin-film transistors (hereinafter termed "TFTs"). The device may be, for example, an active matrix liquid crystal display or other flat panel display, or any type of large area electronic device with thin-film circuitry, for example, a thin-film data store or image sensor. The invention also relates to the devices manufactured by such methods.

BACKGROUND OF THE INVENTION

There is currently much interest in developing thin-film circuits with TFTs and/or other semiconductor circuit elements on glass and on other inexpensive insulating substrates for large area electronics applications. Such TFTs fabricated with amorphous or polycrystalline semiconductor films may form the switching elements of a cell matrix, for example in a flat panel display as described in U.S. Pat. No. 5,130,829 (our reference PHB 33646), the whole contents of which are hereby incorporated herein as reference material. Recent developments involve the fabrication and integration of thin-film circuits (often using polycrystalline silicon) as, for example, integrated drive circuits for such a cell matrix. In order to increase the circuit speed, it is advantageous to use semiconductor material of good crystal quality and high mobility for the thin film bodies of the semiconductor circuit elements. In order to form such semiconductor material, it may be necessary to carry out processing steps at temperatures higher than those which the substrate can satisfactorily withstand.

U.S. Pat. No. 5,206,749 discloses a method of manufacturing an electronic device comprising a thin-film circuit having semiconductor circuit elements, which method comprises the steps of:

(a) depositing a thin film of material on a temporary support to provide a thin-film semiconductor body for the semiconductor circuit elements on the temporary support, and (b) transferring the thin-film semiconductor body from the temporary support to a substrate.

At least a part of this substrate is retained in the manufactured device and comprises electrically insulating material adjacent to the semiconductor thin-film bodies. It may be, for example, of a low temperature glass or a plastics material. By using a temporary support which is able to withstand higher temperatures than the substrate, the temperature restrictions on the formation of good quality semiconductor material for semiconductor thin-film bodies of the semiconductor circuit elements can be overcome. The whole contents of U.S. Pat. No. 5,206,749 are hereby incorporated herein as reference material.

U.S. Pat. No. 5,206,749 suggests adopting several measures in order to free the thin-film semiconductor body from the temporary support after their transfer to the substrate. Several of these measures involve depositing insulating material (e.g silicon dioxide or silicon nitride) on the temporary support before depositing the thin-film semiconductor body material, so as to provide a weakly-adhering or etchable release layer for the thin-film semiconductor body. However, in the case of a weakly-adhering release layer, it is difficult to cleave the release layer from the temporary support to which it requires good adhesion during the provision of the semiconductor body. In the case of an etchable release layer there can be a problem in providing adequate access for the etchant to the layer sandwiched between the substrate and the temporary support. As an alternative measure, U.S. Pat. No. 5,206,749 suggests attaching to the temporary support a releasable adhesive tape whose adhesion can be released by ultra-violet irradiation after securing the thin-film semiconductor body to the substrate.

SUMMARY OF THE INVENTION

It is an aim of the present invention to provide a more advantageous form of temporary support for the thin-film semiconductor body for the semiconductor circuit elements.

According to the present invention, there is provided a method of manufacturing an electronic device comprising a thin-film circuit having semiconductor circuit elements, which method comprises the steps of:

(a) depositing a thin film of material on a temporary support to provide a thin-film semiconductor body for the semiconductor circuit elements on the temporary support, and (b) transferring the thin-film semiconductor body from the temporary support to a substrate, at least a part of which substrate is retained in the manufactured device, and which method in accordance with the present invention is characterised by the temporary support being a metal foil having opposite front and back faces which are unattached over most of their area, the thin-film semiconductor body is provided on the front face, and at least most of the metal foil is etched away by etching into the back face after the thin-film semiconductor body is secured to the substrate.

Such a use of a metal foil in accordance with the present invention provides a simple temporary support requiring few processing steps for its provision, use and subsequent removal. The metal foil can be chosen to withstand high temperatures during the provision of the thin-film semiconductor body (e.g during deposition of the material and possible crystallisation with a laser beam) and during difficult subsequent processing of the thin-film (e.g when annealing an ion implantation in the thin-film). The thermal conductance of the metal foil permits a more uniform heat distribution in the thin film during a heating step in, for example, crystallisation of the film, as a result of which the film may have better homogenous properties. The metal foil also permits good adhesion to the thin-film semiconductor body. Having a back face which is unattached for most of its area, there is easy access for etchant to the metal foil, and so the foil is easily removed by etching in this manner.

The back face of the metal foil may rest against a backing plate while providing the thin-film semiconductor body on the front face. In this case, in order to form a single transportable unit, the metal foil may be mounted in a frame to which the backing plate is secured. However, the metal foil may be sufficiently self supporting and sufficiently rigid that it does not require any backing plate.

When the semiconductor circuit elements comprise dopant-implanted regions, the dopant ions are preferably implanted in the thin-film semiconductor body when the body is mounted on the front face of the metal foil; in this case, the metal foil can provide a discharge path for electrostatic charge from the ions during the implantation, and the implanted regions can also be annealed by heating before transfer of the thin-film semiconductor body to the substrate.

A thin metal film of a different metal from that of the metal foil may be deposited on the front face of the metal foil before providing the thin-film semiconductor body. Such a metal film may serve a variety of purposes. The metal film may act as a barrier layer between the metal of the metal foil and circuit element layers deposited on the foil. Thus, for example, the metal film may prevent an undesirable chemical reaction or doping between the metal foil and an insulating film of the semiconductor circular elements or the thin-film semiconductor body itself. As it is of a different metal, the metal foil may be etched away with an etchant which does not remove the thin metal film. In this case, the thin metal film may be subsequently patterned to retain part of the thin metal film in the manufactured device as electrical connections of the semiconductor circuit elements.

In many cases, it is desirable for the semiconductor circuit elements to comprise first and second insulating films between which the thin-film semiconductor body is sandwiched. The first insulating film can be deposited on the metal foil before providing the thin-film semiconductor body, and the second insulating film can be deposited on the thin-film semiconductor body before transferring the thin-film semiconductor body to the substrate. At the present time silicon is a preferred semiconductor material for most applications. The active regions of the semiconductor circuit elements may comprise amorphous silicon. However, higher mobilities are obtained when polycrystalline silicon material or substantiality single crystal material is provided for the semiconductor circuit elements. Thus, for example, the thin-film semiconductor body may comprise semiconductor crystalline material formed by depositing amorphous silicon on the metal foil and crystallising the amorphous silicon on the metal foil by heating the amorphous silicon with an energy beam, for example a laser beam. A metal foil is able to withstand such high temperature processing, as well as providing a more uniform heat spread. It is also able to withstand other difficult processing steps, for example, ion implantation in the thin-film semiconductor body and the annealing of the implant.

The thin-film semiconductor body may be etched into individual bodies of the circuit elements on the front face of the metal foil before transfer to the substrate, and the substrate may then be formed against the front face of the metal foil so as to embed the individual thin-film bodies flush with the surface of the substrate. Such a process reduces topographical steps at the surface of the substrate for subsequent processing of the semiconductor circuit elements on the substrate.

There is considerable freedom in the choice of substrate to which the thin-film semiconductor body is transferred. Typically the substrate comprises electrically insulating material, at least adjacent to the thin-film semiconductive body. In order to produce a low-cost device, it is advantageous for the substrate to be of a plastics material. A plastics substrate is particularly appropriate for a low-cost data store in plastic card form. However, it may also be used for low-cost display panels and/or image sensors. The material of the substrate may be such as to be transparent to radiation used in subsequent processing of the thin-film semiconductor bodies on the substrate. Thus, for example, the substrate material may be transparent to ultraviolet radiation which is used in a photolithographic step and/or in programming/erasing the memory state of thin-film memory elements in the device. In the case of photolithography, the circuit elements may be fabricated by steps which include forming an opaque pattern on the thin-film semiconductor body (either before or after securing to the substrate), coating the thin-film semiconductor body with a photoresist film after securing to the substrate, and selectively exposing the photoresist film by illumination through the substrate and through the thin-film semiconductor body while using the opaque pattern as a photomask.

The substrate material may be such as to adhere by itself to the thin-film semiconductor body. It may be moulded onto the thin-film structure. However, more versatility is obtained when the face of the substrate adjacent to the thin-film semiconductor body comprises a layer of insulating adhesive.

BRIEF DESCRIPTION OF THE DRAWING FIGURES

These and other features in accordance with the invention are illustrated specifically in embodiments of the invention now to be described, by way of example, with reference to the accompanying diagrammatic drawings. In these drawings.

Figure 1:
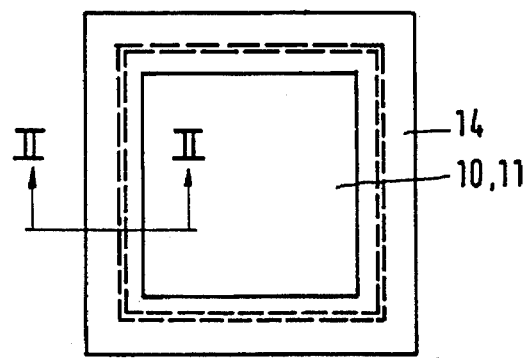
FIG. 1 is a plan view of at temporary support for the formation of a thin-film semiconductor body in the manufacture of an electronic device in accordance with the present invention.

It should be noted that all the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE INVENTION

Figure 2:
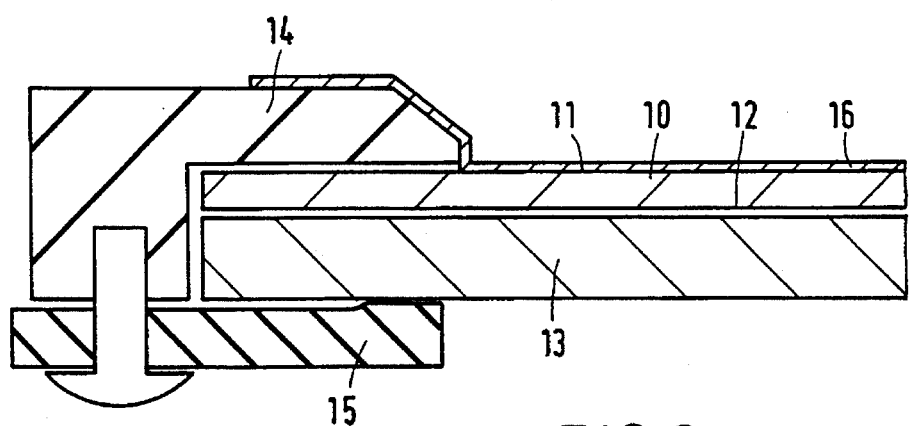
FIG. 2 is a cross-section on the line II—II of FIG. 1.
Figure 7:
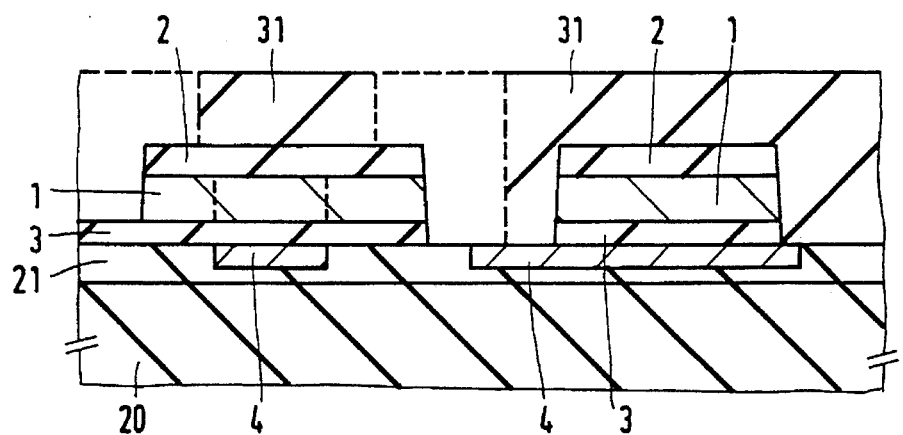
Figure 8:
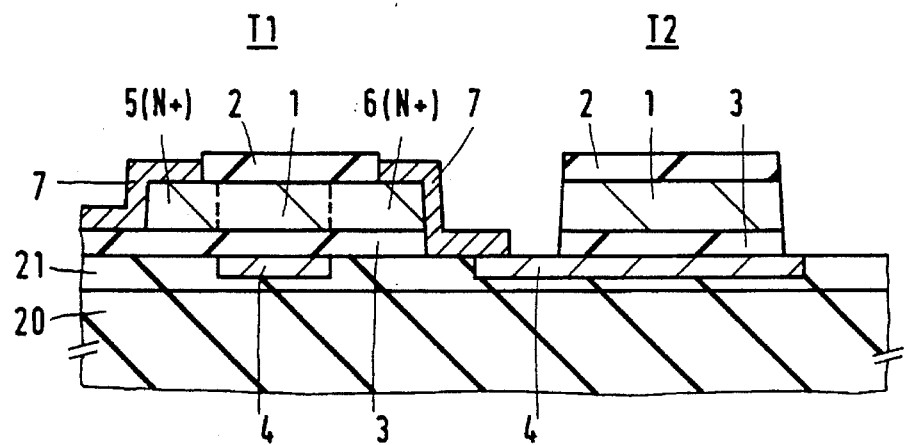

The temporary support of FIGS. 1 and 2 and the processing steps illustrated in FIGS. 3 to 8 and FIGS. 9 to 11 are used to fabricate semiconductor circuit elements from a thin-film semiconductor body formed on the temporary support 10. These semiconductor circuit elements are part of a thin-film circuit of a large-area electronic device, for example, a flat panel display as illustrated in U.S. Pat. No. 5,130,829 or U.S. Pat. No. 5,206,749, or a large-area image sensor, or a data store. A part of such a manufactured device is illustrated in FIG. 8. It comprises a device substrate 20 on which the thin-film circuitry is present, for example as a matrix of TFT switching transistors and TFT drive circuits. FIG. 8 shows cross sections through two such TFTs, T1 and T2. Each TFT has a separate thin-film body comprising separate parts of a silicon thin film 1 sandwiched between first and second insulating films 2 and 3. The silicon film 1 provides a channel region of the TFT which is of substantially intrinsic conductivity type (I) between highly-doped (N+) semiconductor source and drain electrodes 5 and 6 of the TFT. The TFT has a gate electrode formed from a conductive thin film 4, and the insulating film 3 forms the gate dielectric between the gate electrode 4 and the channel region 1. The source and drain electrodes 5 and 6 have connections formed by separate parts of another conductive thin film 7. The conductive films 4 and 7 form connection patterns on the substrate 20 for the thin-film circuit. FIG. 8 shows a cross-section of transistor T1 along the length of channel region 1 between its source and drain electrodes 5 and 6. The cross-section through transistor T2 is across the width of the channel region 1, i.e perpendicular to the cross-section of transistor T1.

In a specific embodiment of the device, the semiconductor film 1 may be of polycrystalline silicon, formed by laser crystallisation of amorphous silicon material. The insulating films 2 and 3 may be of silicon dioxide or silicon nitride. The conductive film patterns 4 and 7 may be of chromium. The semiconductor source and drain electrodes 5 and 6 may be ion-implanted regions of the film 1. The substrate 20 may be of a low temperature glass or of a plastics material. Specially with a plastics material, the device substrate 20 may be such that it cannot withstand the temperatures used during the deposition of the material for the semiconductor film 1, and/or the laser crystallisation of such a film 1, and/or in connection with ion-implantation of dopant into such a film 1 to form the source and drain electrodes 5 and 6. Thus, for most of the polymer materials which are desirable for use as a plastics substrate, the processing temperatures during manufacture should not exceed about 250° C. These problems are avoided in a method in accordance with the present invention which comprises the steps of:

(a) depositing a thin film 1 on a temporary support 10 to provide the thin-film semiconductor body for the TFTs on the temporary support 10 (see FIGS. 1 to 4), and (b) transferring the thin-film semiconductor body from the temporary support 10 to the device substrate 20 (see FIGS. 5 to 8) which comprises electrically insulating material adjacent to the thin-film semiconductor body 1.

In accordance with the present invention, the temporary support 10 is a metal foil having opposite front and back faces 11 and 12 which are unattached over most of their area. The thin-film semiconductor body 1 is provided on the front face 11 of the metal foil (see FIG. 3). At least most of the metal foil 10 is etched away by etching into the back face 12 after the thin-film semiconductor body is secured to the substrate 20 (see FIG. 5).

The temporary support structures of FIGS. 1 to 2 and the processing steps of FIGS. 1 to 8 will now be described in more detail:

The metal foil 10 may be of, for example, aluminium, or nickel, or chromium, or molybdenum, or copper, or gold. Preferably copper and gold are avoided because if these two metals come into contact with the semiconductor film 1, they may dope and degrade the semiconductor material. The foil 10 may have a thickness in the range of, for example, 10 to 50 μm (micrometers). In a specific example, FIGS. 1 and 2 illustrate an aluminium foil having a thickness of about 10 μm supported with a backing plate 13 in a frame 14. The backing plate 13 and frame 14 may be of, for example, stainless steel or a ceramic material. The aluminium foil 10 rests against the backing plate 13 until the foil 10 with the silicon body 1 is secured to the device substrate 20. The plate 13 may be secured in the frame 14 by releasable clips 15. FIG. 1 shows a top plan view of the frame 14 and foil 10, in which the clips 15 are not illustrated. The foil 10 mounted with the backing plate 13 in the frame 14 forms a single unit which can be transported readily between and through different equipments used in the manufacturing process (e.g deposition, photolithography, etching and implantation equipments) until the thin-film structure is secured to the device substrate 20.

As illustrated in FIG. 2, thin metal film 16 may be deposited on the front face 11 of the aluminium foil 10 before providing the thin-film semiconductor body 1. This thin-metal film 16 may be, for example, 200 nm (nanometres) of sputtered chromium.

Figure 3:
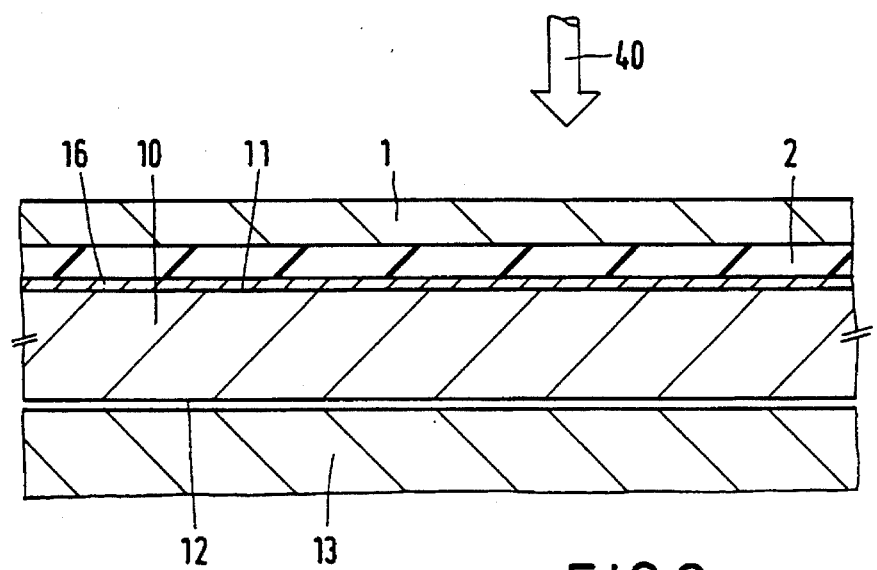
FIGS. 3, 4, 5, 6, 7, 8 are cross-sectional views of a thin-film semiconductor body formed on this temporary support and subsequently transferred to a substrate of the device.

Silicon material is then deposited on the foil 10 to form a thin film 1. The silicon film 1 may be deposited as amorphous silicon material by a low pressure chemical vapour deposition (LPCVD) process at between 500° C. and 550° C., or by a plasma-enhanced chemical vapour deposition (PECVD) process at a deposition temperature of up to 300° C. Such deposition temperatures are higher than the temperature which most plastics substrates 20 can withstand. As illustrated in FIG. 3, an insulating film 2 (for example of silicon nitride) may be deposited before the silicon film 1.

FIG. 3 illustrates a laser crystallisation stage in the formation of the silicon film 1 for the TFTs. In this stage, the film 1 is irradiated with a laser beam 40, for example, of ultraviolet radiation from an excima laser. By this means, the amorphous material is melted adjacent to the upper surface of the film 1 and crystallises into polycrystalline silicon material. It is difficult to carry out such a laser crystallisation treatment on a plastics substrate 20, because the plastics material would be vaporised where the laser beam 40 impinges on the plastics material.

Figure 4:
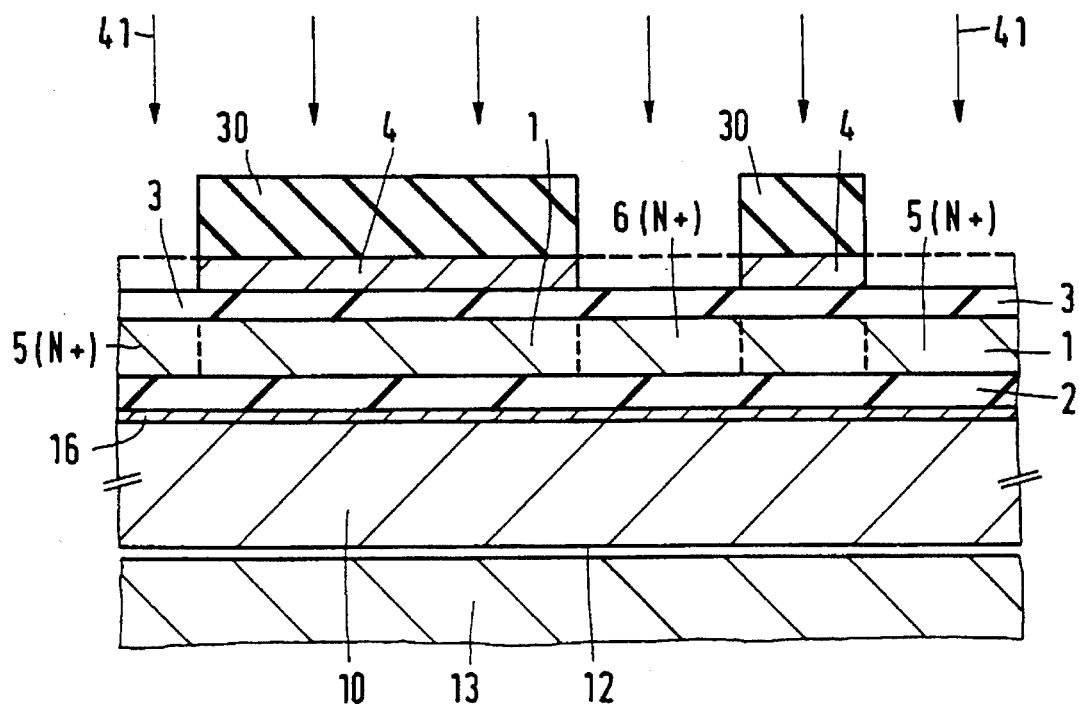

After crystallising the silicon film 1, the second insulating film 3 is deposited. The metal film 4 of, for example, sputtered chromium is then deposited and patterned to form the desired gate electrodes and interconnections. FIG. 4 illustrates the photoresist mask 30 used in a photolithographic and etching process to pattern the film 4. As illustrated in FIG. 4, the resist mask 30 on the chromium film 4 may also be used as at least a part of an implantation mask for localising the implantation of phosphorous or arsenic dopant ions 41 into the silicon film 1 to form the semiconductor source and drain electrodes 5 and 6. After the implantation, the structure is heated to a temperature of, for example, 500° C. in order to anneal the implants. It is difficult to carry out such implantation and annealing on a substrate 20 of plastics material, since the plastics material can be degraded by the implantation and annealing step. Furthermore, undesirable build-up of electrostatic charge on the thin-film structure from the ions 41 can be avoided by connecting the steel frame 14 and/or clip 15 at a suitable potential (e.g earth potential) in the ion implantation machine so as to provide a safe discharge path via the metal foil. This is a further advantage of carrying out the ion implantation with the thin-film structure mounted on the metal foil 10. For the same reason, it can be advantageous to carry out the implantation before the etching step to pattern the metal film 4 on the front face of the thin-film structure.

Furthermore, during the heating steps (in the deposition and crystallisation of the film 1 and in its implantation anneal), the thermal conductance of the metal foil permits a more uniform heat distribution over the area of the film 1. This permits a more homogenous crystalline film 1 to be obtained with less strain in its crystallographic structure.

Figure 5:
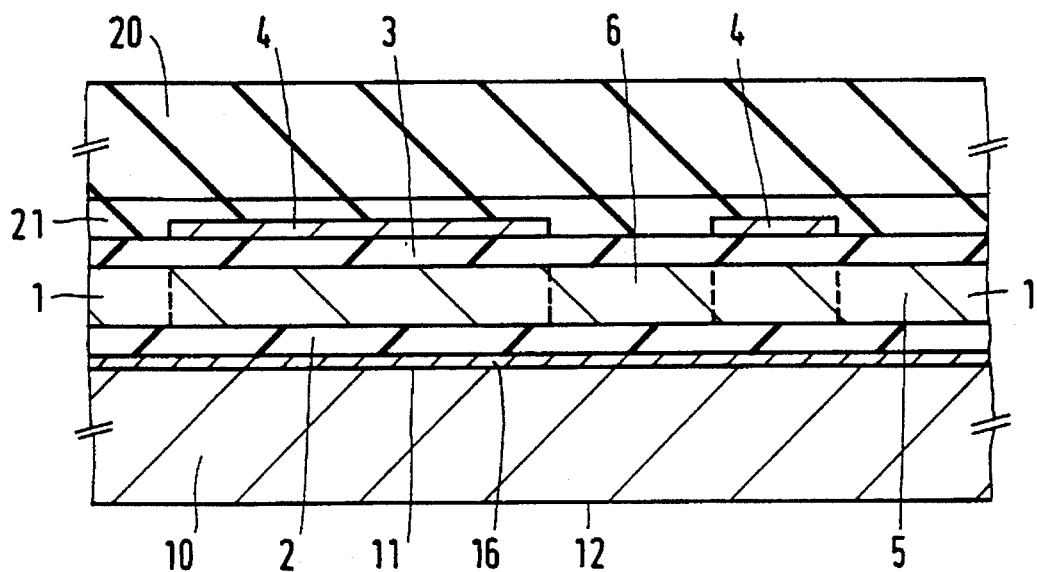
Figure 6:
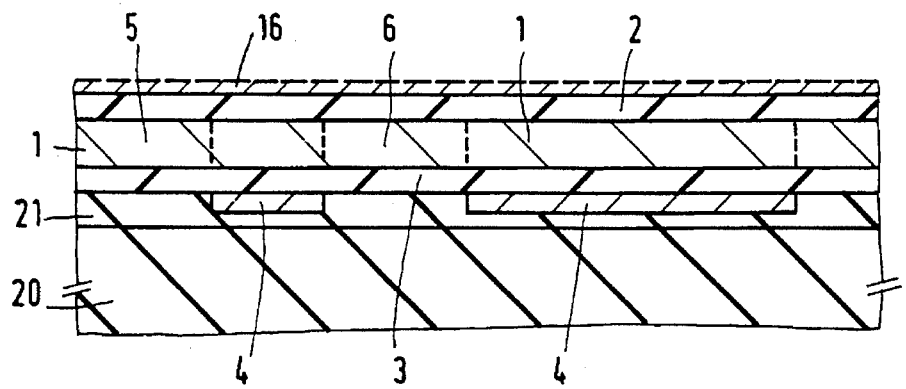

The plastics substrate 20 is then provided. A wide range of polymer materials may be used for the substrate 20, for example polyethylenes, polypropylenes, polyethylsulphones and polyimides. With some of these materials, the substrate 20 may be formed by moulding the polymer material against the thin-film structure, but the substrate 20 is provided conveniently in most cases by pressing a preformed polymer substrate against an adhesive coating 21 on the thin-film structure. FIG. 5 shows the resulting arrangement with the thin-film structure sandwiched between the metal foil 10 and the plastics substrate 20.

The metal foil 10 is now removed from the frame 14. The substrate 20 carrying the thin-film structure and the metal foil 10 is then immersed in an etchant bath to etch away the metal foil 10. The whole of the back face 12 of the metal foil 10 is free and unattached and so the etchant etches into the back face 12 over the whole area of the metal foil 10. This permits a fast and easy and reliable removal of the metal foil 10 from the thin film-structure. An etchant may be used which does not remove the thin metal film 16. Thus, for example, in a specific example, an etchant solution of 400 mils of orth-phosphoric acid, 25 mils of acetic acid and 25 mils of nitric acid in 50 mils of water may be used to remove an aluminium foil 10 without etching a chromium film 16. The thin-film structure is now simply mounted on the plastics substrate 20.

The thin-film structure of the plastics substrate 20 is now divided into individual bodies for the thin-film circuit elements. FIG. 7 shows the two bodies for the two transistors T1 and T2 of FIG. 8. Selected areas of the various films may also be removed for various purposes. FIG. 7 illustrates a photolithographic and etching step in which a photoresist pattern 31 is provided on the thin film structure for etching windows in the insulating layer 2. These windows include the contact windows for the connections 7 to the source and drain electrodes 5 and 6. The chromium film 16 may be completely removed from the thin-film structure. However, part of the film 16 may be retained in an area of the device as part of the electrical connections of semiconductor circuit elements. A further metal film 7 is deposited and patterned to form the connections shown in FIG. 8.

In a specific embodiment, the silicon film 1 may be, for example, 400 nm thick, and the films 16, 2, 3, 4 and 7 may be about 200 nm. The thickness of polymer forming the plastics substrate 20 depends upon the particular device application, and may be, for example, in the range of 200 to 900 μm. When an adhesive coating 21 is used, its thickness may be about 1 μm or more.

Figure 9:
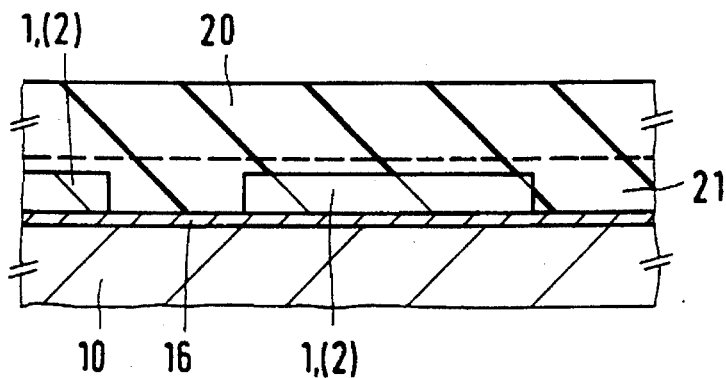
FIGS. 9, 10, 11 are similar cross-sectional views to those of FIGS. 3 to 8, but showing processing step variants in the manufacturing method in accordance with the present invention.
Figure 10:
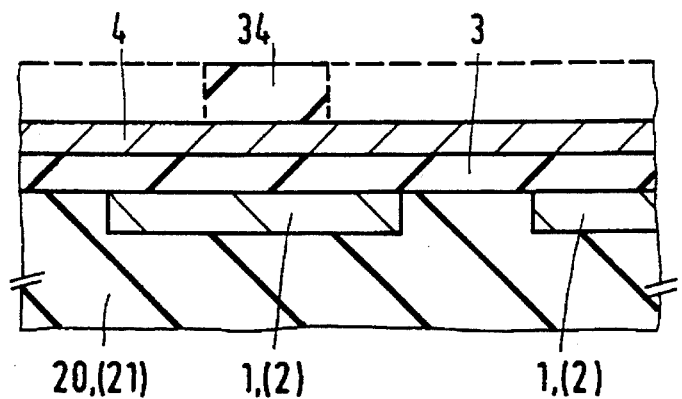
Figure 11:
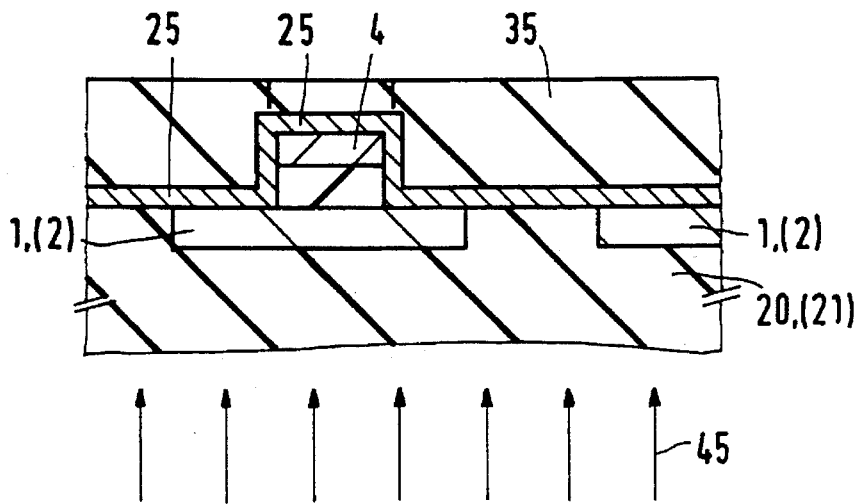

It will be evident that many modifications and variations are possible in accordance with the present invention. The embodiment of FIGS. 9 to 11 illustrates two such modifications. As illustrated in FIG. 9, the silicon thin-film 1 may be divided into separate bodies on the metal foil 10 before transferring to the substrate 20. In this case, the substrate 20 (or at least an adhesive layer 21) may be formed against the front face of the metal foil 10 so as to embed the individual thin-film bodies 1 flush with the surface of the substrate 20,21 as illustrated in FIG. 9. An advantage of this arrangement is that it provides a flat surface to the substrate 20,21 and silicon film bodies 1 for subsequent device processing. Thus, as shown in FIG. 10, there are no topographical steps between the thin-film bodies 1 and the substrate 20,21 for the deposition of subsequent thin-films, for example, a gate insulating layer 3 and gate electrode layer 4. FIG. 10 illustrates these films 3 and 4 with a photoresist mask 34 for defining the gate structure in a photolithographic and etching step.

FIG. 11 illustrates a subsequent stage in which a conductive film 25 is deposited on the thin-film structure and is coated with a photoresist layer 35. This photoresist layer 35 is selectively exposed by illumination 45 through the substrate 20,21 and through the thin-film structure 1 and 25. The gate pattern 4 is opaque to the radiation 45 and so acts as a photomask. As the photoresist 35 is of the negative type, it is soluble where masked by the gate 4 so forming an etchant window at this area for defining the source and drain electrodes from the conductive layer 25 in the manner described in U.S. Pat. No. 5,264,383 (our ref: PHB 33727). The whole contents of U.S. Pat. No. 5,264,383 are hereby incorporated herein as reference material. The TFT of FIG. 11 may be manufactured using similar process steps to those described in U.S. Pat. No. 5,264,383, except that the silicon bodies 1 are transferred from the metal foil 10 to a plastics substrate 20 and are embedded flush with the surface of the substrate 20,21. The polymer material chosen for the plastics substrate 20 (and any adhesive 21) is transparent to the ultraviolet radiation 45 used in the back exposure step illustrated in FIG. 11.

In the preceding description of the specific embodiments of FIGS. 3 to 11, the semiconductor circuit elements were polycrystalline silicon TFTs. However, instead of using polycrystalline silicon material, TFTs may be formed in amorphous silicon material which is similarly transferred from the metal foil 10 to the plastics substrate 20. Instead of TFTs, other semiconductor circuit elements may be formed in the circuit, for example, thin-film diodes. Furthermore, it is not necessary to deposit a semiconductor material to provide the semiconductor film 1. The semiconductor film 1 may be formed on the metal foil 10 by depositing a dielectric insulating material (for example, a silicon-rich non-stoichiometric insulating material of silicon oxide and/or nitride and/or carbide) and then converting the deposited material into polycrystalline silicon as described in published European Patent Application EP-A-0 561 462 (our ref: PHB 33784), the whole contents of which are hereby incorporated herein as reference material. As described in EP-A-0 561 462, both thin-film diodes and TFTs may form the active circuit elements of a thin-film circuit on the device substrate. The present invention may also be used with semiconductor circuit elements formed from thin-film semiconductor materials other than silicon which are already known for thin-film circuit fabrication.

From reading the present disclosure, other variations and modifications will be apparent to persons skilled in the art. Such variations and modifications may involve equivalent and other features which are already known in the design, manufacture and use of thin-film semiconductor circuit elements in electronic devices, and which may be used instead of or in addition to features already described herein. Although claims have been formulated in this application to particular combinations of features, it should be understood that the scope of the disclosure of the present application also includes any novel feature or any novel combination of features disclosed herein, either explicitly or implicitly or any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during the prosecution of the present application or any further application derived therefrom.

I claim:

1. A method of manufacturing an electronic device comprising a thin-film circuit having semiconductor circuit elements, which method comprises the steps of:

(a) depositing a thin film of material on a temporary support to provide a thin-film semiconductor body for the semiconductor circuit elements on the temporary support, and (b) transferring the thin-film semiconductor body from the temporary support to a substrate, at least a part of which substrate is retained in the manufactured device, characterised in that the temporary support is a metal foil having opposite front and back faces which are unattached over most of their area, the thin-film semiconductor body is provided on the front face, and at least most of the metal foil is etched away by etching into the back face after the thin-film semiconductor body is secured to the substrate.

2. A method as claimed in claim 1, further characterised in that the back face of the metal foil rests against a backing plate while providing the thin-film semiconductor body on the front face.

3. A method as claimed in claim 2, further characterised in that the metal foil is mounted in a frame to which the backing plate is secured to form a single transportable unit.

4. A method as claimed in claim 1, further characterised in that a thin metal film of a different metal from that of the metal foil is deposited on the front face of the metal foil before providing the thin-film semiconductor body.

5. A method as claimed in claim 4, further characterised in that the metal foil is etched away with an etchant which does not remove the thin metal film, after which the thin metal film is patterned to retain part of the thin metal film in the manufactured device as electrical connections of the semiconductor circuit elements.

6. A method as claimed in claim 1, further characterised in that the semiconductor circuit elements comprise first and second insulating films between which the thin-film semiconductor body is sandwiched, the first insulating film being deposited on the metal foil before providing the thin-film semiconductor body, and the second insulating film being deposited on the thin-film semiconductor body before transferring the thin-film semiconductor body to the substrate.

7. A method as claimed in claim 1, further characterised in that the thin-film semiconductor body comprises semiconductor crystalline material formed by depositing amorphous silicon on the metal foil and crystallising the amorphous silicon on the metal foil by heating the amorphous silicon with an energy beam.

8. A method as claimed in claim 1, further characterised in that dopant ions are implanted in the thin-film semiconductor body on the front face of the metal foil to provide doped regions of the semiconductor circuit elements, the metal foil provides a discharge path for electrostatic charge from the ions during the implantation, and the implanted regions are annealed by heating before transfer of the thin-film semiconductor body to the substrate.

9. A method as claimed in claim 1, further characterised in that the thin-film semiconductor body is etched into individual bodies of the circuit elements on the front face of the metal foil before transfer to the substrate, and the substrate is formed against the front face of the metal foil so as to embed the individual thin-film bodies flush with the surface of the substrate.

10. A method as claimed in claim 1, further characterised in that the circuit elements are fabricated by steps which include coating the thin-film semiconductor body with a photoresist film after securing to the substrate, and selectively exposing the photoresist film by illumination through the substrate and through the thin-film semiconductor body whilst using an opaque pattern on the thin-film semiconductor body as a photomask.

11. A method as claimed in claim 1, further characterised in that the substrate is of a plastics material.

12. A method as claimed in claim 1, further characterised in that the face of the substrate adjacent to the thin-film semiconductor body comprises a layer of insulating adhesive.

* * * * *